United States Patent [19]

Tigelaar

[11] Patent Number: 5,036,020

[45] Date of Patent: Jul. 30, 1991

[54] METHOD OF FABRICATING MICROELECTRONIC DEVICE INCORPORATING CAPACITOR HAVING LOWERED TOPOGRAPHICAL PROFILE

[75] Inventor: Howard L. Tigelaar, Allen, Tex.

[73] Assignee: Texas Instrument Incorporated, Dallas, Tex.

[21] Appl. No.: 576,257

[22] Filed: Aug. 31, 1990

[51] Int. Cl.⁵ .............................................. H01L 21/70
[52] U.S. Cl. ...................................... 437/60; 437/919; 437/47; 437/54; 148/DIG. 14
[58] Field of Search ..................... 437/60, 919, 47, 54, 437/191, 193, 52; 148/DIG. 14

[56] References Cited

U.S. PATENT DOCUMENTS

| | | | |
|---|---|---|---|
| 4,373,250 | 2/1983 | Malwah | 437/191 |
| 4,460,911 | 7/1984 | Salters | 357/23.6 |
| 4,630,088 | 12/1986 | Dgura et al. | 357/41 |
| 4,665,608 | 5/1987 | Okamoto et al. | 148/DIG. 14 |
| 4,827,323 | 5/1989 | Tigelaar et al. | 357/51 |

FOREIGN PATENT DOCUMENTS

| | | | |
|---|---|---|---|
| 0003270 | 1/1983 | Japan. | |
| 0104156 | 6/1984 | Japan. | |
| 0225864 | 10/1986 | Japan. | |
| 0308365 | 12/1988 | Japan | 437/919 |
| 0022057 | 1/1989 | Japan | 437/919 |
| 2143675 | 2/1985 | United Kingdom | 437/60 |

*Primary Examiner*—Brian E. Hearn
*Assistant Examiner*—Michael Trina
*Attorney, Agent, or Firm*—Richard A. Stoltz; James T. Comfort; Melvin Sharp

[57] ABSTRACT

A microelectronic device (10a) provides an improved capacitor (12a) having two plate members (22a, 26a) capacitively coupled via a dielectric layer (24). In accordance with the invention, contact portions (32a, 42a) have substantially twice the thickness of functional portions (28, 38) prior to etching oxide (16) to form contacts (18, 20). In this fashion, the total thickness of capacitor (12a) is minimized yet the thickness of contact portions (32a, 42a) is maximized. Hence, maximum thickness for etching purposes [to construct metal contact 18, 20)] is achieved. Thus the topographical profile of microelectronic device (10a) is essentially reduced to half that of the prior art while the necessary pre-etch thickness of contact portions (32a) and (42a) is maintained. Other pre-etch thickness proporations may be utilized between conductive layer subportions (34) and (36) and conductive layer subportions (44) and (46). For example, the conductive layer subportion (34) might be 2000 angstroms and the conductive layer subportion (36) might be 1000 angstroms so that a total preetch thickness of 3000 angstrom for contact portion (32a) is still achieved. In another embodiment of the invention, additional conductive layers may be added so that the respective plate members become interleaved, enhancing the capacitance of the resulting capacitor. In such an alternative embodiment, the individual thickness of the conductive layers may be decreased and yet by the advantageous configuration of the invention, the pre-etch thickness of the contact portions are not decreased and thus a contact etch may be safely performed.

6 Claims, 2 Drawing Sheets

METHOD OF FABRICATING MICROELECTRONIC DEVICE INCORPORATING CAPACITOR HAVING LOWERED TOPOGRAPHICAL PROFILE

BACKGROUND OF THE INVENTION

1. Field of the Invention

This invention relates to microelectronic devices incorporating capacitors. More particularly, it is concerned with the method and structure for forming a capacitor of reduced thickness for improved wafer topography.

2. Description of the Prior Art

As the dimensions of microelectronic devices decrease, an increasingly critical concern is the topography of the wafer. In particular, it is important that the topographical profile be lowered as much as possible in order to facilitate lithographic techniques thereat. That is to say, a lowered topographical profile generally tends to diminish depth-of-focus problems encountered with lithographic techniques. Within this context, capacitors sited near the top surfaces of wafers need smaller vertical dimensions. But simply reducing the thickness of a capacitor creates its own set of problems. In particular, as the thickness of the capacitive plates is decreased, the likelihood that a given capacitive layer will be etched completely through is increased. For example, a capacitor located on a substrate typically has other materials such as insulators positioned above it. Therefore it is often necessary to etch contacts in order to form electrical connection to the capacitor plates. If the plates are thin, there is the danger of etching through one or more of the plates. Etching at or close to the site of the capacitor might also be required for any number of other purposes.

Thus, the thickness of the capacitor and its components is obviously important. Yet the potential for decreasing the thickness of a capacitor is not infinite, but is controlled by the need for sufficient thickness for etching purposes. Typically, the thickness for etching purposes is a more limiting constraint than the thickness required for electrical conductivity of the capacitor.

In the context of the current etching technology, the thickness required for etching purposes depends upon the material used, but is a minimum of about 3000 angstroms for polysilicon to ensure that etches done thereover do not completely etch through the capacitor or some component thereof.

The amount of thickness required for safe etching will undoubtedly vary as etching technology changes and improves, as a function of the selectivity of the materials being etched and the particular structure and application of the capacitor in question. However, the general requirement that sufficient capacitor thickness be provided for a given application will remain, despite the changes in these parameters.

What is needed, then, is a method which allows for reducing the depth of the functional portions of the capacitor yet provides sufficient thickness at the portions of the capacitor over which etching will occur, e.g. where contacts will be formed.

SUMMARY OF THE INVENTION

The problems outlined above are in large measure solved by the device in accordance with the present invention. That is to say, the device hereof provides vertically scaled functional portions (i.e. capacitively coupled portions), yet allows sufficient capacitor thickness for etching at other portions. The device in accordance with the present invention provides a first plate member, a dielectric layer disposed adjacent to the first plate member and a second plate member capacitively coupled with the first plate member. The second plate member is disposed adjacent the dielectric layer. The first plate member has a functional portion and a contact portion. Likewise, the second plate member has a functional portion and a contact portion. The functional portion of the first plate member and the functional portion of the second plate member are capacitively coupled via the dielectric layer, while the contact portions are thicker than the respective functional portions, such thickness being sufficient to provide an adequate site for etching purposes.

For example, as a method of making the above-described structure, a first conductive layer (e.g. polysilicon) is formed on a microelectronic wafer substrate and lithographically isolated into a major portion and a minor portion. A dielectric layer is formed adjacent the major portion of the first conductive layer. Then a second conductive layer is formed on top of the dielectric layer. The second conductive layer is also isolated into a major and minor portion. The major and minor portions of the first conductive layer are electrically isolated from one another by the dielectric layer. In addition, the major portion of the second conductive layer is isolated from the major portion of the first conductive layer. According to the invention, the major portion of the first conductive layer and the minor portion of the second conductive layer are configured to form the first plate member while the minor portion of the first conductive layer and the major portion of the second conductive layer are configured to form the second plate member.

In preferred embodiments, each conductive layer is formed to a thickness of approximately 1500 angstroms. In this fashion the two layers form a structure which is about 3000 angstroms thick and yet the functional portion of each plate member, being about 1500 angstroms, has less thickness than the contact portion of each plate member. The pre-etch thickness of each contact portion is about 3000 angstroms and thus is sufficiently thick for etching purposes.

In an alternative embodiment, a plurality of conductive layers are sequentially formed and patterned into major and minor portions, the major and minor portions of each conductive layer being electrically isolated by subsequent dielectric layers. Once again the various major and minor portions are configured to form relatively thicker contact portions and relatively thinner functional portions.

For example, a second dielectric layer is laid on top of the second conductive layer thereby isolating the major and minor portions thereof. Then a third conductive layer is formed and lithographically patterned so as to be isolated into a major and a minor portion. In this fashion an interleaved effect is created. In this embodiment the first plate member actually has two functional portions (the second plate member still having one functional portion) and so the capacitance of the inventive capacitor is essentially doubled compared to that of the first embodiment.

Likewise, a fourth conductive layer could be added after a third dielectric layer with the major and minor portion isolation effected in strictly analogous fashion.

Therefore to achieve a capacitor having a total thickness of about 3000 angstroms, for example, a total of about six conductive layers of 500 angstroms thickness, would produce a structure wherein the respective contact portions would be about 3000 angstroms thick while each functional portion of the respective first and second plate members would be about 500 angstroms thick. Thus, the entire thickness of the capacitor in profile would be about 3000 angstroms and yet the capacitance of the structure would be greatly enhanced.

DESCRIPTION OF THE PREFERRED EMBODIMENTS

Figure 5:
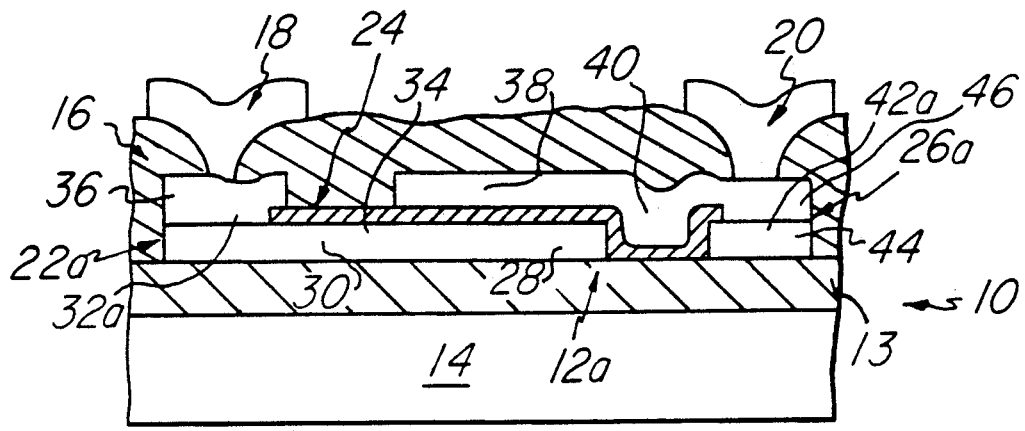
FIG. 5 is a partial view of a microelectronic device incorporating a capacitor and contact structures formed in accordance with the present invention.

Referring now to the drawings in general, and FIG. 5 in particular, a microelectronic device 10a incorporating the inventive concept is partially depicted. Device 10a features a capacitor 12a situated on a field oxide 13 which is formed on a substrate 14. A covering oxide 16 and metal contacts 18, 20 generally cover capacitor 12a. In accordance with the invention, capacitor 12a presents a reduced thickness yet provides adequate areas for connection with contacts 18, 20 such that it is lithographically practical to do so without the danger of etching completely through 12a and thereby making device 10a non-functional for its intended purposes. The purposes of capacitors in microelectronic devices are well known in the art and it should be noted that other parts of microelectronic device 10a (not shown) may include, for example, integrated circuit components such as memory cells and logic cells, or even discrete components.

Figure 7:
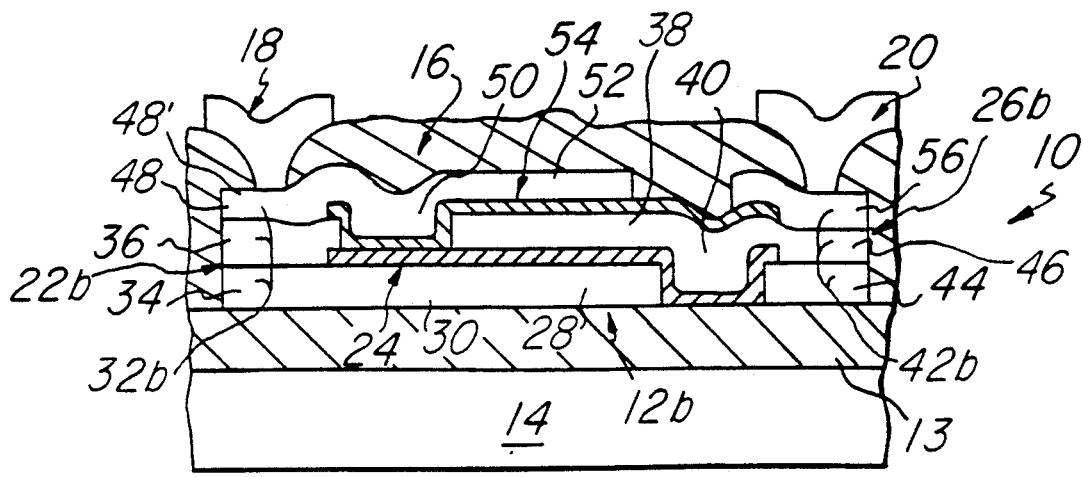
FIG. 7 depicts a partial view of the final structure of an alternative embodiment of the present invention.

Likewise, FIG. 7 shows an alternative microelectronic device 10b having a modified capacitor 12b. Both capacitors 12a and 12b provide lowered topographical profiles, as compared with the prior art, and hence devices 10a and 10b present beneficially lowered topographical profiles in accordance with the invention.

Referring to FIG. 5, capacitor 12a includes a first plate member 22a, a dielectric layer 24 and a second plate member 26a. First plate member 22a and second plate member 26a are capacitively coupled via dielectric layer 24 and contacts 18, 20 serve to electrically connect the capacitor 12a to other portions of the circuitry of device 10a, (for example voltage sources) as is well known in the art.

Substrate 14 may be made of any semiconducting material such as silicon, germanium, gallium arsenide or any other such semiconductor material, whether doped or not. In the preferred embodiment, wafer-grade monocrystalline silicon is preferred.

First plate member 22a can be constructed of any conductive material, for example a metal, but in the preferred embodiment doped polycrystalline silicon is used. Hereinafter the term "polysilicon" will be used for "polycrystalline silicon". It should be noted that different materials could be used respectively for the first plate member 22a and second plate member 26a so long as both plate members were conductive and suitable for the specific application intended.

First plate member 22a includes a functional portion 28, an intermediate portion 30 and a contact portion 32a. Functional portion 28 acts as a capacitive plate and functions capacitively in a conventional manner well known in the art of microelectronics. Functional portion 28 should be thick enough for the particular electrical application in the circuit. Generally speaking, the lower limit of thickness in the context of current technology is about 1000 angstroms. This minimum thickness could well decrease with improvements in the art, but the general inventive concept would still apply regardless of the minimum thickness and it is intended that such improvements in technology are within the scope and spirit of this invention. In the preferred embodiment, the thickness of functional portion 28 is about 1500 angstroms.

Intermediate portion 30 is integrally formed with functional portion 28 and has approximately the same thickness thereas. The difference between intermediate portion 30 and functional portion 28, as will readily be appreciated by casual inspection, is that intermediate portion 30 is not suitably situated for capacitive coupling in the structural context of capacitor 12a.

Contact portion 32a is connected to intermediate portion 30 and has a thickness greater than functional portion 28. The present practical limit of the ratio of the thickness of contact portion 32a to the thickness of functional portion 28 is about 6 to 1 but in the preferred embodiment the ratio is about 2 to 1. That is to say, the preferred thickness of contact portion 32a is about 3000 angstroms while, as mentioned above, the thickness of functional portion 28 is about 1500 angstroms.

Contact portion 32a has a first conductive layer subportion 34 and a second conductive layer subportion 36, each subportion having a thickness of about 1500 angstroms in the preferred embodiment. The reason contact portion 32a has two subportions is simply a matter of design choice and is not necessarily a limiting aspect of the invention. However, in the preferred embodiment capacitor 12a is in fact constructed by the method of forming two conductive layers and this processing technique will be described in detail below. The advantage of having a double thickness in contact portions 32a and 42a is that contact holes can be etched to these sites without fear of etching through the material.

Subportions 34 and 36 are intimately connected so as to be electrically conductive and thus current may be conducted from functional portion 28 to second conductive layer subportion 36 and vice versa.

Dielectric layer 24 may be made of any insulating material suitable for serving as a dielectric material in the context of a specific application. In the preferred embodiment, dielectric layer 24 is made of a silicon dioxide layer having a thickness on the order of 100 angstroms and a silicon nitride layer having a thickness on the order of 150 angstroms. First dielectric layer 24 is shown as one layer for ease of illustration and it should be understood that other combinations of insulating materials (such as an oxide-nitride-oxide sandwich, or ONO layer) could serve equally well. Dielectric layer 24 is formed adjacent first plate member 22a.

Particularly, it will be seen that dielectric layer 24 is adjacent functional portion 28, intermediate portion 30, first conductive layer subportion 34 and second conductive layer subportion 36.

Second plate member 26a, as in the case of first plate member 22a, may be made of any conductive material, such as a metal. In the preferred embodiment, the conductive material is doped polysilicon. Second plate member 26a includes a functional portion 38, an intermediate portion 40 and a contact portion 42a.

Functional portion 38, in a fashion analogous to functional portion 28, acts as a capacitive plate, and thus the thickness of functional portion 38 must be sufficient for the particular application. In the preferred embodiment, the thickness of functional portion 38 is about 1500 angstroms.

Intermediate portion 40 is integrally formed with functional portion 38 and has the same thickness thereas, namely 1500 angstroms. But, as can readily be appreciated by casual inspection, intermediate portion 40 does not act as a capacitive plate in a strict sense.

Contact portion 42a is connected to intermediate portion 40 and has a thickness greater than functional portion 38. In the preferred embodiment, the thickness of contact portion 42a is about 3000 angstroms so that the ratio of the contact portion to the functional portion is about 2 to 1. It is believed that the practical limit of this ratio of thicknesses is in a range of from no more than about 6 to 1 to no less than about 1.5 to 1. That is to say, the maximum ratio of the contact portion to the functional portion is about 6 to 1, while the practical minimum is about 1.5 to 1. The ratio could theoretically go to a minimum as low as 1 to 1, but as the ratio approaches 1 to 1 certain advantages of the invention are minimized, as will become clear from the discussion below. It should be noted that the upper range limit of 6 to 1 is in the context of polysilicon, which, as stated above, necessitates a contact portion thickness of 3000 angstroms for etching purposes. Where metal conductive layers are used, an upper range limit greater than 6 to 1 may occur.

Contact portion 42a includes a first conductive layer subportion 44 and a second conductive layer subportion 46. Each of the subportions has a thickness of about 1500 angstroms for the resultant total thickness of 3000 angstroms for contact portion 42a. Subportions 44 and 46 are intimately connected so as to be electrically conductive and thus current may be conducted from second conductive layer subportion 46 to functional portion 38 and vice versa. It should be noted that the particular manner of construction wherein two separate conductive layer subportions are stacked upon each other is not necessarily central to the invention, but this particular construction is shown for illustrative purposes in view of the method of the preferred embodiment.

Referring now to FIG. 7, an alternative embodiment of the present invention is depicted featuring device 10b with a modified capacitor 12b. By inspection it will become clear that the major difference between capacitors 12a and 12b is the addition of one additional conductive layer in the case of 12b. However, it should be appreciated that capacitor 12b and device 10b are shown for illustrative purposes only and that any number of additional conductive layers (with appropriate dielectric layers) could be added on top of the structure of capacitor 12b so as to exploit the advantages of the invention, as described herein. Thus it should be understood that any number, or plurality, of conductive layers for the construction of the first plate member and second plate member may be desirable in a given application of the present invention.

In particular, in distinguishing the differences between capacitor 12a and capacitor 12b it will be noted that first plate member 22b of capacitor 12b has a third conductive layer subportion 48. Subportion 48 is intimately connected to subportion 36 so as to be electrically conductive therewith. First plate member 22b also includes intermediate portion 50 and functional portion 52.

Capacitor 12b further includes a second dielectric layer 54. Dielectric layer 54 acts in cooperation with dielectric layer 24 and oxide 16 to conductively insulate first plate member 22b from second plate member 26b.

Second plate member 26b further includes third conductive layer subportion 56. Subportion 56 is intimately connected to subportion 46 so as to be electrically conductive therewith. It will be noted that both functional portion 28 and functional portion 52 are capacitively coupled to functional portion 38 so that the capacitance of capacitor 12b is essentially doubled in comparison to the capacitance of capacitor 12a. It should also be noted that the thickness of functional portions 28, 38 and 52 is 1500 angstroms, as will be discussed below. Likewise, the thickness of intermediate portions 30, 40, 50 is each about 1500 angstroms. Finally, the thickness of first conductive layer subportions 34, 36, 48, 44, 46, 56 is each about 1500 angstroms.

As described with reference to capacitor 12a, capacitor 12b presents intimate electrical contact between adjacent parts so that current may be conducted from first plate member 22b and second plate member 26b to contacts 18, 20, respectively.

As with first dielectric layer 24, second dielectric layer 54 may employ any insulating material suitable for serving as a dielectric but silicon dioxide plus silicon nitride is preferred. The preferred thickness for second dielectric layer 54 is about 100 angstroms of silicon dioxide and 150 angstroms of silicon nitride, for a total thickness of about 250 angstroms. As with first dielectric layer 24, second dielectric layer is shown as one layer for ease of illustration and it should be understood that other combinations of insulating materials could serve equally well. Second dielectric layer 54 is further adjacent functional portion 52, intermediate portion 50 and third conductive layer subportion 48 as well as second conductive layer subportion 36, functional portion 38, intermediate portion 40, third conductive layer subportion 56 and second conductive layer subportion 46.

A method for making the inventive device 10a will now be described. It should be noted that other methods for forming the inventive structure are possible, and any description as to the preferred method of making the inventive device should not be interpreted as limiting the scope of the invention. Rather, the process for making the inventive device should be viewed simply as a preferred method.

Figure 1:
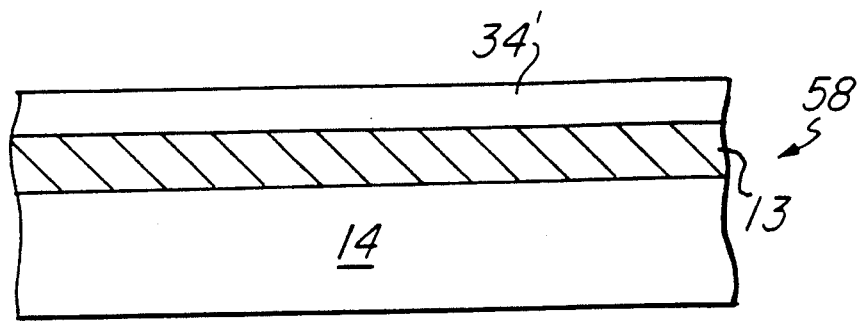
FIG. 1 is a sectional view of a portion of a wafer at an initial stage of the process for forming a structure in accordance with the present invention.

Referring to FIG. 1, substrate 14 is shown with field oxide 13 formed thereon and with a first conductive layer 34' formed on field oxide 13. Formation of first conductive layer 34' is the first step in the process after providing a substrate 14 with field oxide 13. It should be noted in this regard that any topographical modifications appropriate to the particular application may be made on substrate 14 prior to formation of first conductive layer 34'. Such modifications will typically deal with the processing of other devices on the substrate so, for example, there may be oxide pads formed on substrate 14, epitaxial silicon layers or any other number of such structures, as will be understood by those skilled in the art prior to formation of first conductive layer 34'. It should be understood that any such intervening structural layers interposed between substrate 14 and first conductive layer 34' are within the scope of the invention and may be added as needed for other processing of an integrated-circuit device incorporating the inventive structure.

In the preferred method first conductive layer 34' is made of polysilicon and is formed to a thickness of approximately 1500 angstroms. Methods for such formation are well known in the art and will not be described further herein. Other conductive materials besides polysilicon may be used, for example any number of metals may be appropriate.

First conductive layer 34' is then saturation doped for appropriate conductivity, as is well known in the art. First conductive layer 34' is then patterned.

Figure 2:
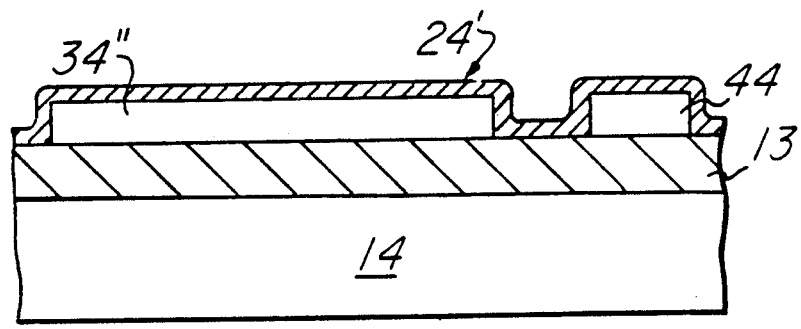
FIGS. 2-4 are sectional views of progressive steps in the method of forming the structure in accordance with the present invention.

Referring to FIG. 2, it will be readily appreciated that after patterning, first conductive layer 34' becomes the resultant structures major portion 34" and minor portion 44. The structure denoted by reference numeral 44 is also referred to above as first conductive layer subportion 44. After the formation of major portion 34" and minor portion 44, a thin conformal insulation layer 24' is formed uniformly over substrate 14 as shown so that major portion 34" and minor portion 44 are not only spatially separated but also electrically insulated from one another. Insulation layer 24' is actually formed of two layers, silicon dioxide (100 angstroms) and silicon nitride (150 angstroms), but is shown as one layer for ease of illustration. Insulation layer 24' is then patterned.

It should also be noted that it may be advantageous to planarize with an oxide layer (not shown), of about the same thickness as first conductive layer 34', after patterning first conductive layer 34' and prior to forming insulation layer 24'. In this fashion, a more planar topography may be preserved and indeed such a planarizing oxide layer could be formed after the patterning and etching of any given conductive layer in the inventive capacitor (i.e. a planarizing oxide layer technique could be used repeatedly in a multi-conductive-layer scheme).

Figure 3:
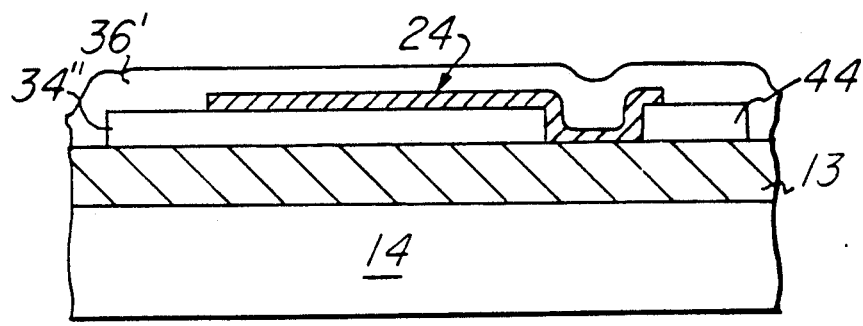

Referring to FIG. 3, dielectric layer 24 is lithographically formed from insulation layer 24'. A second conductive layer 36' is then formed over the resulting structure. Once again, the preferred thickness is about 1500 angstroms and the preferred conductive material is polysilicon. However, with respect to choosing a material for first conductive layer 34', any conductive material which is appropriate to the particular application of the invention may be utilized as desired. Second conductive layer 34' is then saturation doped to achieve the desired conductivity therein.

Figure 4:
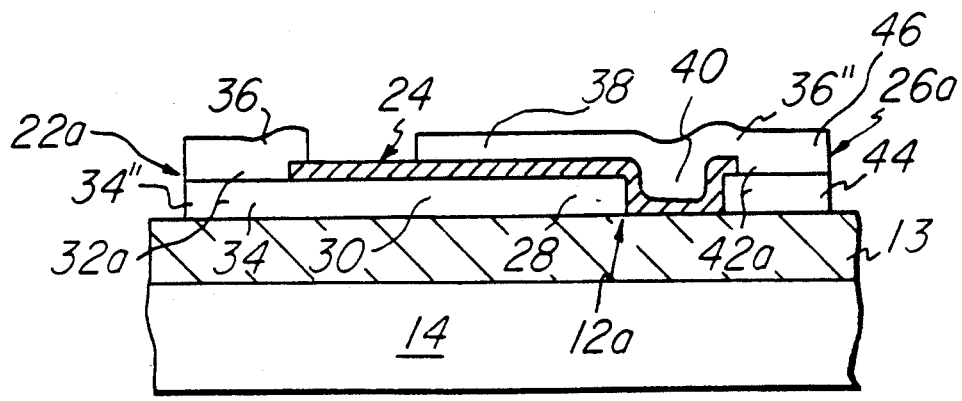

Referring to FIG. 4, second conductive layer 36' has been patterned and the resulting structures are minor portion 36 (the structure indicated by reference numeral 36 is also referred to as second conductive layer subportion 36 above) and major portion 36". Major portion 34" and major portion 36" are advantageously configured to achieve capacitive coupling therebetween.

In particular, major portion 34" is composed of functional portion 28, intermediate portion 30 and first conductive layer subportion 34 while major portion 36" is composed of functional portion 38, intermediate portion 40 and first conductive layer subportion 46. Hence, functional portions 28 and 38 are geometrically configured for advantageous capacitive coupling in accordance with the invention.

It will also be noted that minor portion 36 and major portion 34" are configured so that contact portion 32a is advantageously formed with a thickness (3000 angstroms) approximately double that of either conductive layer (1500 angstroms) by itself. Likewise, it will be noted that contact portion 42a is formed from the advantageous configuration of major portion 36" and minor portion 44 so that the thickness of contact portion 42a (3000 angstroms) is approximately twice the thickness of either conductive layer (1500 angstroms) by itself. In this fashion, capacitor 12a is formed in accordance with the invention, providing relatively thin functional portions and relatively thick contact portions.

Referring to FIG. 5, covering insulator 16 made of, for example, silicon dioxide, is then formed in covering arrangement over capacitor 12a. After the formation of covering insulator 16 a contact etch is performed therethrough and metal contacts 18, 20 are accordingly formed as shown. In accordance with the invention, at least about 3000 angstroms of thickness is needed for contact portion 32a and contact portion 42a prior to the etch necessary for formation of contacts 18, 20. Thus when the contact etch is performed prior to the formation of contacts 18 and 20, it is assured that the contact etch will not etch completely through contact portions 32a and 42a, which would of course be undesirable as will be readily appreciated by those skilled in the art. For example, such etching might well destroy the functional benefits of capacitor 12a or indeed microelectronic device 10a in general. In this vein, it will readily be appreciated that the thicknesses and proportions of contact portions 32a and 42a to the remainder of capacitor 12a are an idealization. That is to say, in reality, contact portions 32a and 42a may have diminished thicknesses after performing the contact etch through insulator 16. Thus when contacts 18 and 20 are formed they may go deeper into insulator 16 and contact portions 32a and 42a may have lesser thicknesses than 3000 angstroms.

Once contacts 18 and 20 have been formed other processing steps not particularly relevant to the present invention may also be performed for the purpose of connecting contacts 18 and 20 to other portions of the circuitry of microelectronic device 10a. It will also be readily appreciated that not all processing steps (e.g. cleaning surfaces after etching etc.) have been described but rather only the steps particularly related to the present invention.

The topography, the other parts of the circuitry utilized in microelectroic device 10a, and the applications of capacitor 12a and other parts of the circuitry involved in microelectronic device 10a will all dictate certain changes in the processing steps. Thus, those skilled in the art will appreciate that other adaptations may be made in the processing steps.

The formation of microelectronic device 10b will now be described. It will be readily appreciated that most of the comments relevant to the construction of microelectronic device 10a will also be relevant in the context of microelectronic device 10b except where noted.

Figure 6:
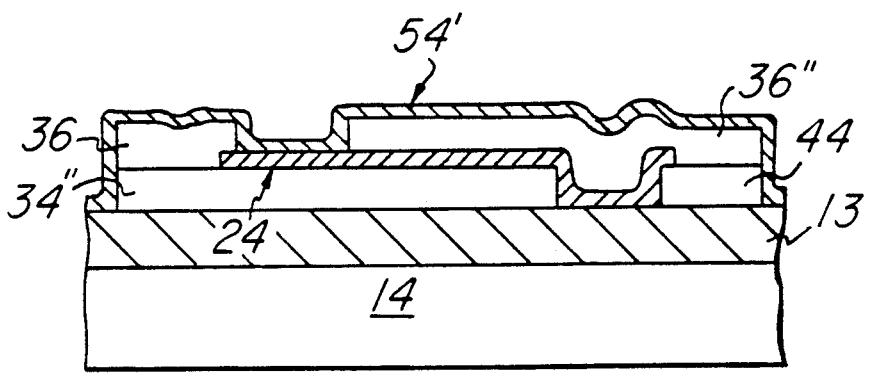
FIG. 6 depicts an additional processing step in forming an alternative embodiment of the present invention.

Referring to FIG. 6, workpiece 58 is depicted. Workpiece 58 is made by taking the structure as shown in FIG. 4 and further adding a second conformal insulation layer 54' thereto. Thus the processing steps through FIG. 4 may be used in conjunction with the formation of second insulation layer 54'. In the preferred embodiment, second insulation layer 54' is made of a silicon dioxide layer having a thickness on the order of 100 angstroms and a silicon nitride layer having a thickness on the order of 150 angstroms. Second insulation layer 54' is shown as one layer for ease of illustration and it should be understood that other combinations of insulating materials (such as an oxide-nitride-oxide sandwich, or ONO layer) could serve equally well.

Referring to FIG. 7, second insulation layer 54' is patterned to achieve a second dielectric layer 54 as shown. A third conductive layer (not shown as initially formed) is then deposited upon the resulting structure. The third conductive layer is saturation doped and then patterned to achieve a major portion consisting of third conductive layer subportion 48, intermediate portion 50 and functional portion 52 as well as a minor portion 56 (which is also referred to above as third conductive layer subportion 56).

The thickness of the third conductive layer is 1500 angstroms and same may be made of any conductive material. Once again, the preferred conductive material is doped polysilicon. After the patterning of the third conductive layer, insulating layer 16 and contacts 18, 20 are then formed in a manner analogous to that of device 10a. Thus the total thickness of capacitor 12b is about 4500 angstroms prior to the contact etch. Once the contact etch has been performed the resulting thicknesses of contact portions 32b and 42b may be significantly less than 4500 angstroms.

It should be further noted that the first conductive layer 34', second conductive layer 36' and the third conductive layer could be formed to each have a thickness of approximately 1000 angstroms so that capacitor 12b would then have a total thickness of about 3000 angstroms rather than 4500 angstroms. In this fashion, the total profile of capacitor 12b could be maintained at about 3000 angstroms and yet each conductive layer would have accordingly smaller individual thicknesses.

It should also be noted that any number of conductive layers could be laid one on top of the other so that the invention is by no means limited to three conductive layers. The main requirement utilizing this particular geometry is that the major portion and the minor portion of each conductive layer, after patterning, be configured with each of the adjacent layers such that electrical isolation between the major and minor portion of each layer is possible by adding a new dielectric layer thereon. Further it is necessary that each minor portion be configured with the major portion below it as well as that the major portion of a given conductive layer be configured with the minor portion below it so that not only is conductive insulation achieved by the configuration but also the advantageous stacking in accordance with the invention so that each ultimate contact portion has the desired thickness for etching purposes. It should also be noted that other geometries may well be utilized in practicing this invention, the principle of which is that the contact portion is thicker than the functional portion.

It should also be noted that as the etching requirements are decreased i.e. as requirements of less than 3000 angstroms are achieved, the total profile could thereby be diminished so that, for example, capacitor 12a could be modified so that each conductive layer is only about 1000 angstroms in processing resulting in a profile of about 2000 angstroms.

The operation of the capacitor 12a in microelectronic device 10a will readily be understood by those skilled in the art, and thus no further detail with respect to the functioning of capacitor 12a will be described. It will be appreciated that such operation will be a function of the application in the context of the rest of the integrated circuitry or other circuitry of microelectronic device 10a.

Although the invention has been described in detail herein with reference to its preferred embodiment and certain described alternatives, it is to be understood that this description is by way of example only, and is not to be construed in a limiting sense. It is to be further understood that numerous details of the embodiments of the invention, and additional embodiments of the invention, will be apparent to, and may be made by persons of ordinary skill in the art having reference to this description. It is contemplated that all such changes and additional embodiments are within the spirit and true scope of the invention as claimed below.

What is claimed is:

1. A method for forming a microelectronic device incorporating a capacitor having a lowered topographical profile, the method comprising the steps of:
   (a) providing a substrate;
   (b) forming a first conductive layer;
   (c) removing selected portions of said first conductive layer to form a major portion of said first conductive layer and a minor portion of said first conductive layer therefrom, said major portion of said first conductive layer being laterally spaced from said minor portion of said first conductive layer, said major portion of said first conductive layer including a functional portion and a first conductive layer subportion;
   (d) forming a thin conformal insulation layer over said major portion of said first conductive layer and said minor portion of said first conductive layer;
   (e) removing selected portions of said thin conformal insulation layer to form a dielectric layer, said dielectric layer including portions overlying said functional portion of said major portion of said first conductive layer;
   (f) forming a second conductive layer over said major portion of said first conductive layer, said minor portion of said first conductive layer, and said dielectric layer;
   (g) removing selected portions of said second conductive layer to form a major portion of said second conductive layer and a minor portion of said second conductive layer therefrom, said major portion of said second conductive layer being laterally spaced from said minor portion of said second conductive layer, said major portion of said second conductive layer including a functional portion and a second conductive layer subportion,
   said minor portion of said second conductive layer and said first conductive layer subportion being intimately connected so as to be electrically conductive, said minor portion of said first conductive layer and said second conductive layer subportion being intimately connected so as to be electrically conductive, said functional portion of said major portion of said second conductive layer directly overlying said dielectric layer and said functional portion of said major portion of said first conductive layer.

2. A method of forming a capacitor in conjunction with a microelectronic device having a substrate, the method comprising:
   (a) forming a first plate member adjacent the substrate, said first plate member having a functional portion and a contact portion, said functional portion and said contact portion of said first plate member having predetermined thicknesses;
   (b) forming a dielectric layer disposed adjacent said first plate member layer; and
   (c) forming a second plate member of conductive material disposed adjacent said dielectric material, said second plate member having a functional portion and a contact portion, said first plate member, said dielectric layer and said second plate member being configured so that said functional portion of said first plate member and said functional portion of said second plate member are capacitively coupled, said functional portion and said contact portion of said second plate member having predetermined thicknesses,
   steps (a) and (c) being selectively performed so that the ratio of thicknesses of said contact portion and said functional portion of said first plate member is in a range of from no more than about 6 to 1 to no less than about 1.5 to 1.

3. The method of claim 2 wherein said first plate member is formed of polysilicon.

4. The method of claim 2 wherein said second plate member is formed of polysilicon.

5. The method of claim 2 wherein one of said first plate and said second plate member is formed of metal.

6. The method of claim 2 wherein said first plate member is formed so that predetermined portions of said functional portion of said first plate member are above certain preselected portions of said functional portion of said second plate member while other preselected portions of said functional portion of said first plate member are below said selected portions of said functional portion of said second plate member with respect to the substrate.

* * * * *